(12) United States Patent
Chen

(10) Patent No.: US 11,784,174 B2
(45) Date of Patent: Oct. 10, 2023

(54) OPTICAL PACKAGE STRUCTURE AND METHOD FOR MANUFACTURING THE SAME

(71) Applicant: Advanced Semiconductor Engineering, Inc., Kaohsiung (TW)

(72) Inventor: Ying-Chung Chen, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 157 days.

(21) Appl. No.: 17/168,010

(22) Filed: Feb. 4, 2021

(65) Prior Publication Data

US 2022/0246592 A1 Aug. 4, 2022

(51) Int. Cl.
| | | |
|---|---|---|
| H01L 25/16 | (2023.01) | |
| H01L 33/52 | (2010.01) | |
| H01L 33/00 | (2010.01) | |
| H01L 31/16 | (2006.01) | |
| H01L 31/02 | (2006.01) | |
| H01L 31/18 | (2006.01) | |
| H01L 33/62 | (2010.01) | |

(52) U.S. Cl.
CPC ...... *H01L 25/167* (2013.01); *H01L 31/02002* (2013.01); *H01L 31/16* (2013.01); *H01L 31/18* (2013.01); *H01L 33/005* (2013.01); *H01L 33/52* (2013.01); *H01L 33/62* (2013.01); *H01L 2933/005* (2013.01); *H01L 2933/0066* (2013.01)

(58) Field of Classification Search
CPC ... H01L 25/075; H01L 25/0756; H01L 25/16; H01L 25/167; H01L 25/041; H01L 25/043; H01L 25/047; H01L 25/13; H01L 25/18; H01L 31/02002; H01L 31/16; H01L 31/18; H01L 31/02164; H01L 31/02327; H01L 31/173; H01L 33/005; H01L 33/52; H01L 33/62; H01L 33/56; H01L 23/3121; H01L 23/552; H01L 23/3128

See application file for complete search history.

(56) References Cited

U.S. PATENT DOCUMENTS

| | | | |
|---|---|---|---|
| 8,227,927 B2 | 7/2012 | Chen et al. | |
| 9,030,832 B2 * | 5/2015 | Kwong | G01S 7/4811 361/752 |
| 9,905,722 B1 * | 2/2018 | Chen | G01S 17/04 |
| 10,177,268 B2 | 1/2019 | Chen et al. | |
| 2011/0157452 A1 | 6/2011 | Goh et al. | |
| 2021/0074691 A1 * | 3/2021 | Lee | H01L 25/0756 |

* cited by examiner

*Primary Examiner* — Calvin Y Choi
(74) *Attorney, Agent, or Firm* — FOLEY & LARDNER LLP

(57) ABSTRACT

An optical package structure and a method for manufacturing an optical package structure are provided. The optical package structure includes a first die, a bumping structure, and a second die. The first die is on a carrier. The bumping structure is over the first die. The bumping structure includes a light-transmitting portion and a light-blocking portion embedded in the light-transmitting portion. The second die is electrically connected to the carrier. The light-blocking portion of the bumping structure is free from covering the second die.

18 Claims, 13 Drawing Sheets ium shift of about ±100 μm, hindering the compactness of the package. Therefore, there is a need to reduce the package thickness and increase the compactness of the optical device package for mobile application.

OPTICAL PACKAGE STRUCTURE AND METHOD FOR MANUFACTURING THE SAME

BACKGROUND

1. Technical Field

The present disclosure relates generally to an optical package structure and a method for manufacturing an optical package structure.

2. Description of the Related Art

For mobile application, optical devices often require a thinner package structure that suffices the function of partition for different detection regions and higher product yield. Conventional plastic lid approach has its limit because the minimum package thickness is greater than 1 mm, and legs of the plastic lid at least occupies an area with a diameter of 0.5 mm without accounting for the plastic lid alignment shift of about ±100 μm, hindering the compactness of the package. Therefore, there is a need to reduce the package thickness and increase the compactness of the optical device package for mobile application.

SUMMARY

In one or more embodiments, an optical package structure includes a first die, a bumping structure, and a second die. The first die is on a carrier. The bumping structure is over the first die. The bumping structure includes a light-transmitting portion and a light-blocking portion embedded in the light-transmitting portion. The second die is electrically connected to the carrier. The light-blocking portion of the bumping structure is free from covering the second die.

In one or more embodiments, an optical package structure includes a first die, a second die, and a bumping structure. The first die is on a carrier and has a first top surface. The second die is on the carrier and has a second top surface non-coplanar to the first top surface. The bumping structure is over the first die. The bumping structure includes a light-transmitting portion and a light-blocking portion embedded in the light-transmitting portion.

In one or more embodiments, a method for fabricating an optical package structure includes the following operations: forming a bumping structure over a first substrate by a wafer-level or panel-level packaging operation, the bumping structure including a light-transmitting portion and a light-blocking portion embedded in the light-transmitting portion; obtaining a plurality of first dies by singulating the first substrate; and integrating a second die with one of the first dies.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
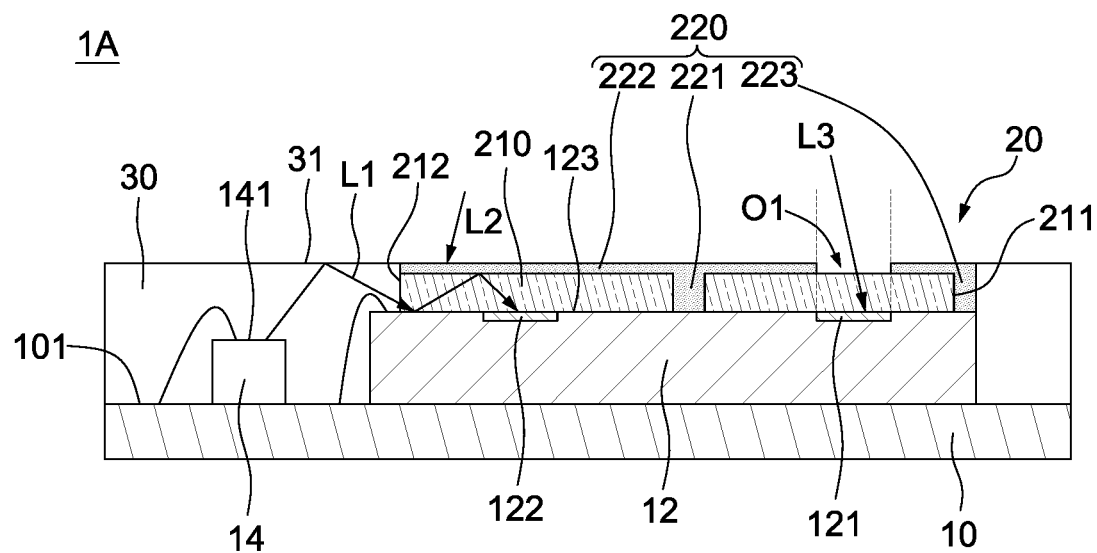
FIG. 1A illustrates a cross-sectional view of an optical package structure in accordance with some embodiments of the present disclosure.

FIG. 1A illustrates a cross-sectional view of an optical package structure 1A in accordance with some embodiments of the present disclosure. The optical package structure 1A includes a carrier 10, dies 12 and 14, a bumping structure 20, and an encapsulant 30. In some embodiments, the optical package structure 1A may be or include a time of flight (TOF) sensor package or a proximity sensor package.

The carrier 10 may include, for example, a printed circuit board, such as a paper-based copper foil laminate, a composite copper foil laminate, or a polymer-impregnated glass-fiber-based copper foil laminate. The carrier 10 may include an interconnection structure, such as a plurality of conductive traces or a through via. In some embodiments, the carrier 10 includes a ceramic material or a metal plate. In some embodiments, the carrier 10 may include a substrate, such as an organic substrate or a leadframe. In some embodiments, the carrier 10 may include a two-layer substrate which includes a core layer and a conductive material and/or structure disposed on an upper surface and a bottom surface of the carrier 10. The conductive material and/or structure may include a plurality of traces.

The die 12 is on the carrier 10. In some embodiments, the die 12 is electrically connected to the carrier 10. In some embodiments, the die 12 is electrically connected to the carrier 10 through one or more bonding wires. In some embodiments, the die 12 has a surface 123 (also referred to as "a top surface"). In some embodiments, the die 12 may be or include a detecting device. In some embodiments, the die 12 may include a light detector which is, for example, a PIN diode (a diode including a p-type semiconductor region, an intrinsic semiconductor region, and an n-type semiconductor region) or a photo-diode or a photo-transistor. In some embodiments, the die 12 includes optical regions 121 and 122. In some embodiments, the surface 123 of the die 12 includes one or more sensing areas (e.g., the optical regions 121 and 122). In some embodiments, a thickness of the die 1 is from about 75 μm to about 100 μm.

The die 14 is on the carrier 10. In some embodiments, the die 14 is electrically connected to the carrier 10. In some embodiments, the die 14 is electrically connected to the carrier 10 through one or more bonding wires. In some embodiments, the die 14 has a surface 141 (also referred to as "a top surface"). In some embodiments, the surface 141 of the die 14 is non-coplanar to the surface 123 of the die 12. In some embodiments, the die 14 may be or include a light-emitting device. In some embodiments, the die 14 may include an emitting die. For example, the die 14 may include a light-emitting diode (LED) or a laser diode. In some embodiments, the die 14 may be or include a vertical-cavity surface-emitting laser (VCSEL). In some embodiments, the surface 141 of the die 14 includes a light-emitting area (not shown). In some embodiments, the optical region 122 of the die 12 is between the die 14 and the optical region 121 of the die 12. In some embodiments, a thickness of the die 14 is about 100 μm.

In some embodiments, the optical package structure 1A does not include a redistribution layer or a metal layer disposed over and electrically connected to the dies 12 and 14. In some embodiments, the optical package structure 1A does not include a redistribution layer or a metal layer projecting over and directly connecting the dies 12 and 14. According to some embodiments of the present disclosure, the surface 141 (also referred to as "the top surface") of the die 14 is non-coplanar to the surface 123 (also referred to as "the top surface") of the die 12, and thus it is unlikely to form an insulating layer on the non-coplanar surfaces 123 and 141 followed by forming a redistribution layer or a metal layer on the insulating layer to electrically connect to both of the dies 12 and 14. The non-coplanar surface 123 and 141 of the dies 12 and 14 hinders subsequent bumping structure to be formed thereon because lack of a planar foundation for the dielectric material and/or the conductive material stacked thereupon.

The bumping structure 20 is over the die 12. In some embodiments, the bumping structure 20 is free from covering the die 14. In some embodiments, the bumping structure 20 includes a light-transmitting portion 210 and a light-blocking portion 220, and the light-blocking portion 220 is embedded in the light-transmitting portion 210. In some embodiments, the light-blocking portion 220 of the bumping structure 20 is free from covering the die 14. In some embodiments, a projection of the light-blocking portion 220 on a surface 101 (also referred to as "a top surface") of the carrier 10 is free from overlapping a projection of the light-emitting area (i.e., the surface 141) of the die 14 on the surface 101 of the carrier 10. In some embodiments, a thickness of the bumping structure 20 is from about 20 μm to about 30 μm.

In some embodiments, the light-transmitting portion 210 is made of or includes a material that that is transparent to a peak wavelength emitted by the die 14 or configured to be received by the die 12. In some embodiments, the light-transmitting portion 210 includes an insulating material. In some embodiments, the light-transmitting portion 210 includes a photoresist material. In some embodiments, the light-blocking portion 220 is made of or includes a material that is opaque to a peak wavelength emitted by the die 14 or configured to be received by the die 12. In some embodiments, the light-blocking portion 220 includes a light-blocking metal layer. In some embodiments, the light-blocking portion 220 includes a light-blocking metal layer which may serve as a shielding layer rather than an electrical connection element (e.g., an RDL). In some embodiments, the light-blocking portion 220 is designed to be a portion electrically isolated from any electrical connection element (e.g., an RDL) and serving only as an electromagnetic shielding structure. In some embodiments, the light-blocking portion 220 includes an insulating material. In some embodiments, the light-blocking portion 220 includes a photoresist material. In some embodiments, the light-blocking portion 220 includes carbon black. In some embodiments, the light-blocking portion 220 includes a photoresist material including a black dye (also referred to as "a black photoresist (PR)") (e.g., Fujifilm SK-9020). In some embodiments, the light-blocking portion 220 includes a resin including a light-absorbing dye. In some embodiments, the blockage of the light-blocking portion 220 can reach a transmittance of $10^{-3}$ (i.e. an OD3 level).

In some embodiments, the light-blocking portion 220 includes wall structures 221 and 223 and a blocking layer 222. In some embodiments, the wall structure 221 is between the optical region 121 and the optical region 122 of the die 12, for example, from a top view perspective. The wall structure 221 can reduce or prevent crosstalk between lights/signals configured to be received by the optical regions 121 and 122, respectively. In some embodiments, the wall structure 223 covers a sidewall 211 of the light-transmitting portion 210 distal to the die 14. In some embodiments, the blocking layer 222 is connected to the wall structures 221 and 223. In some embodiments, the blocking layer 222 covers a portion of a top surface of the light-transmitting portion 210 and exposes at least the optical region 121 from a top view perspective. In some embodiments, the blocking layer 222 defines an opening O1 exposing the optical region 121 from a top view perspective. In some embodiments, the blocking layer 222 of the light-blocking portion 220 defines a light receiving range or a view angle of the optical region 121 of the die 12.

In some embodiments, a size of the opening O1 of the blocking layer 222 is from about 4 μm to about 6 μm. In some embodiments, a size of the opening O1 is about 5 μm with a precision of ±1 μm. In some embodiments, the alignment shift between the opening O1 and the optical region 121 is equal to or less than 2 μm (i.e., an alignment precision of ±2 μm). In some embodiments, the thickness of the blocking layer 222 is from about 1 μm to about 2 μm. In some embodiments, the thickness of the blocking layer 222 is about 1.5 μm. In some embodiments, the width (i.e., along a direction substantially perpendicular to the surface 101 of the carrier 10) of each of the wall structures 221 and 223 is from about 1 μm to about 2 μm. In some embodiments, the width of each of the wall structures 221 and 223 is about 1.5 μm. According to some embodiments of the present disclosure, with the relatively small size of the opening O1 and the relatively great alignment precision between the opening O1 and the optical region 121, a narrow view angle of the optical region 121 of the die 12 can be defined.

In some embodiments, the optical region 121 is exposed from the light-blocking portion 220. In some embodiments, the optical region 121 is exposed from the blocking layer 222 of the light-blocking portion 220. In some embodiments, the light-blocking portion 220 is projecting over the optical region 122. In some embodiments, the blocking layer 222 of the light-blocking portion 220 is projecting over the optical region 122. In some embodiments, light L2 (e.g., ambient light or reflect light from an object) reaching the blocking layer 222 is blocked from entering or reaching the optical region 122. In some embodiments, a sidewall 212 of the light-transmitting portion 210 adjacent to the die 14 is free of light-blocking portion 220, for example, the wall structure 221. In some embodiments, light L3 emitted by the die 14 and reflected by an object outside of the optical package structure 1A (e.g., a human face) can reach the optical region 121 of the die 12, while light L1 emitted by the die 14 can directly pass through the sidewall 212 of the light-transmitting portion 210 and reach the optical region 122 of the die 12. According to some embodiments of the present disclosure, the blocking layer 222 projecting over the optical region 122 and connected to the wall structure 221 that separates the optical region 121 and the optical region 122, the blocking layer 22 can further guide the light L1 entering the light-transmitting portion 210 so as to increase the light intensity detected by the optical region 122 of the die 12.

In some embodiments, the wall structure 221 of the light-blocking portion 220 of the bumping structure 20 is configured to prevent light L2 from reaching the optical region 121. In some embodiments, the optical region 121 (which may serve as a sensing region) of the die 12 is configured to receive or detect light/signal reflected by an object, and the optical region 122 (which may serve as a referencing region) of the die 12 is configured to receive or detect light/signal initially emitted from the die 14, such arrangement constructing a time of flight (TOF) sensor unit.

The encapsulant 30 encapsulates the die 14. In some embodiments, the encapsulant 30 encapsulates the surface 141 (also referred to as "the top surface") of the die 14. In some embodiments, a surface 31 (also referred to as "a top surface") of the encapsulant 30 is substantially non-coplanar to the surface 123 of the die 12. In some embodiments, the surface 123 of the die 12 and the surface 141 of the die 14 are at different elevations. In some embodiments, the surface 31 of the encapsulant 30 is substantially non-coplanar to the surface 141 of the die 14. In some embodiments, a top surface of the blocking layer 222 is substantially coplanar with the surface 31 (also referred to as "the top surface") of the encapsulant 30. In some embodiments, the encapsulant 30 includes an epoxy resin having fillers, a molding compound (e.g., an epoxy molding compound or other molding compound), polyimide, a phenolic compound or material, a material with a silicone dispersed therein, or a combination thereof.

In some cases where emitter(s) and detector(s) and disposed on an organic substrate, encapsulated by a transparent molding compound or covered by a glass layer, and covered by a plastic lid having an opening for defining the light path of the detector(s), the thickness of the plastic lid is normally 1 mm or at least greater than 0.3 mm, and the diameter of the opening of the plastic lid is at least 0.5 mm with a manufacturing precision of ±20 μm. In addition, the alignment shift/tolerance required for the plastic lid is at least ±100 μm. Therefore, the thickness of an optical package structure with the aforesaid structures and arrangements cannot be easily reduced, and the compactness of the optical package structure is relatively poor, which adversely affect the reduction of package size and the increase of the compactness of the package.

In contrast, according to some embodiments of the present disclosure, with the light-blocking portion 220 embedded in the light-transmitting portion 210 of the bumping structure 20, since the thickness of the embedded light-blocking features is significantly less than that of a plastic lid, and the opening defined by the light-blocking portion 210 of the bumping structure 20 is relatively small with a greater precision, the problem of excessive thickness and non-compactness of a conventional optical device package utilizing a plastic lid having opening can be solved. Thus, the overall thickness of the optical package structure 1A is effectively reduced, and the compactness of the optical package structure 1A is increased.

In addition, according to some embodiments of the present disclosure, with the die 14 integrated with the die 12 in a way that the bumping structure 20 is free from covering the die 14, such that the top surface of the die 12 is not necessarily coplanar with the top surface of the die 14, thus the design flexibility is increased, and the manufacturing cost (e.g., the costs of waste components and rework operation) is reduced as well.

Figure 1B:
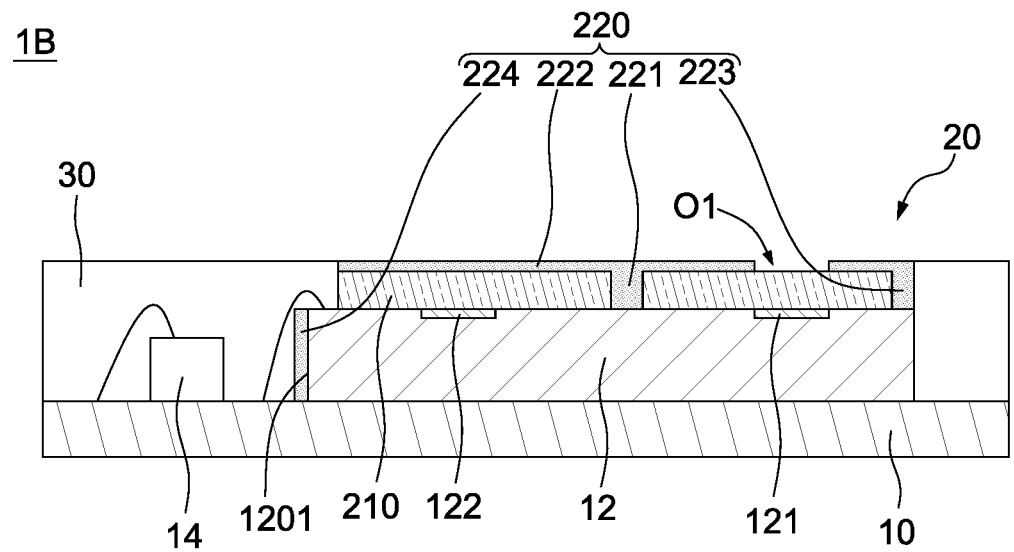
FIG. 1B illustrates a cross-sectional view of an optical package structure in accordance with some embodiments of the present disclosure.

FIG. 1B illustrates a cross-sectional view of an optical package structure 1B in accordance with some embodiments of the present disclosure. The optical package structure 1B is similar to the optical package structure 1A in FIG. 1A except that, for example, the light-blocking portion 220 of the bumping structure 20 of the optical package structure 1B further includes a wall structure 224.

In some embodiments, the wall structure 224 is on a sidewall 1201 of the die 12 proximal to the die 14. In some embodiments, the wall structure 224 covers the sidewall 1201 of the die 12. In some embodiments, the blockage of the wall structure 224 can reach a transmittance of $10^{-3}$ (i.e. an OD3 level). According to some embodiments of the present disclosure, the wall structure 224 can effectively prevent light emitted from the die 14 from entering the substrate of the die 12, and thus reduced the signal interference.

Figure 2A:
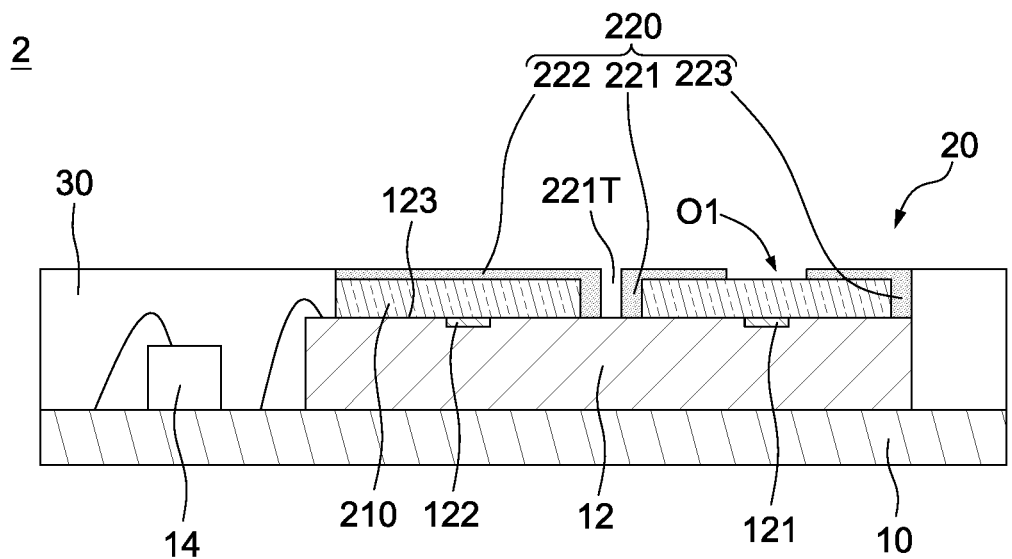
FIG. 2A illustrates a cross-sectional view of an optical package structure in accordance with some embodiments of the present disclosure.

FIG. 2A illustrates a cross-sectional view of an optical package structure 2 in accordance with some embodiments of the present disclosure. The optical package structure 2 is similar to the optical package structure 1A in FIG. 1A except that, for example, the light-blocking portion 220 of the bumping structure 20 of the optical package structure 2 has a trench 221T.

In some embodiments, the trench 221T of the light-blocking portion 220 is within the wall structure 221. In some embodiments, the trench 221T penetrates through the wall structure 221. In some embodiments, the trench 221T divides the wall structure 221 into two separate portions. In some embodiments, a portion of the surface 123 of the die 12 is exposed from the trench 221T. In some embodiments, the trench 221T is filled with air. According to some embodiments, the design of the trench 221T in the wall structure 221 that separates the optical regions 121 is advantageous to the generation of total reflection of lights configured to be received by the optical region 121 and the optical region 122, respectively, and thus cross-talk can be further reduced effectively.

Figure 2B:
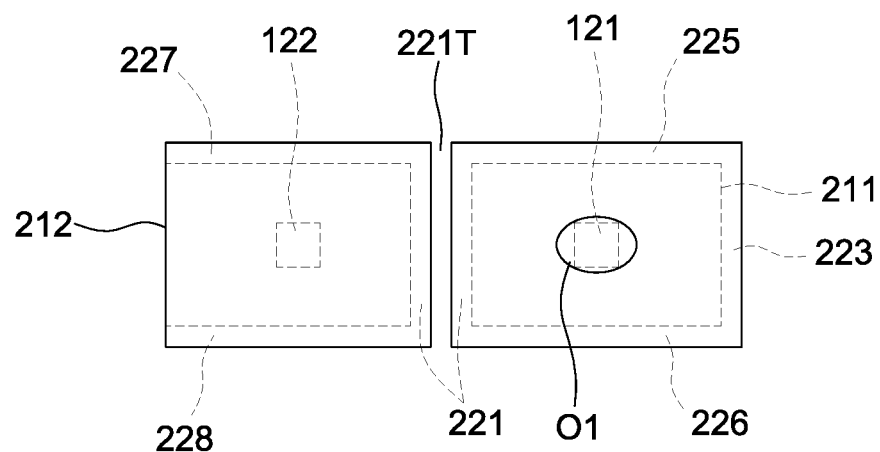
FIG. 2B illustrates an enlarged top view of a portion of an optical package structure in accordance with some embodiments of the present disclosure.

FIG. 2B illustrates an enlarged top view of a portion of an optical package structure 2 in accordance with some embodiments of the present disclosure.

In some embodiments, the optical region 121 and the optical region 121 of the die 12 are separated by the trench 221T within the wall structure 221. In some embodiments, the light-blocking portion 220 further includes wall structures 225 and 226 connected to the wall structures 221 and 223. In some embodiments, the wall structures 221, 223, 225 and 226 surround the optical region 121 of the die 12. In some embodiments, the wall structures 221, 223, 225 and 226 surround a portion of the light-transmitting portion 210 on the optical region 121 of the die 12. In some embodiments, the light-blocking portion 220 further includes wall structures 227 and 228 connected to the wall structures 221. In some embodiments, the wall structures 221, 227 and 228 surround three sidewalls of a portion of the light-transmitting portion 210 on the optical region 122 of the die 12, exposing the sidewall 212 of the light-transmitting portion 210.

Figure 3:
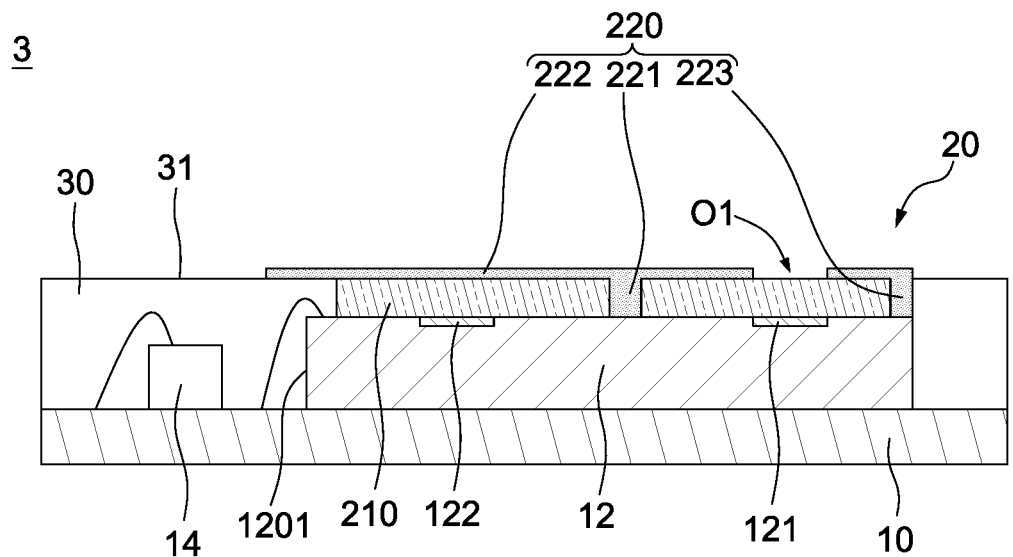
FIG. 3 illustrates a cross-sectional view of an optical package structure in accordance with some embodiments of the present disclosure.

FIG. 3 illustrates a cross-sectional view of an optical package structure 3 in accordance with some embodiments of the present disclosure. The optical package structure 3 is similar to the optical package structure 1A in FIG. 1A except that, for example, the light-blocking portion 220 of the bumping structure 20 of the optical package structure 3 extends toward the die 14.

In some embodiments, a portion (e.g., the blocking layer 222) of the light-blocking portion 220 extends towards the die 14 and overhang an edge (e.g., the sidewall 1201) of the die 12. In some embodiments, the blocking layer 222 of the light-blocking portion 220 is directly on the encapsulant 30. In some embodiments, the blocking layer 222 of the light-blocking portion 220 directly contacts a portion of the surface 31 of the encapsulant 30. Compared to the light-blocking portion 220 in FIG. 1A, the extension of the blocking layer 222 in FIG. 3 can better collect the light L1 emitting from the die 14 to the optical region 122.

Figure 4:
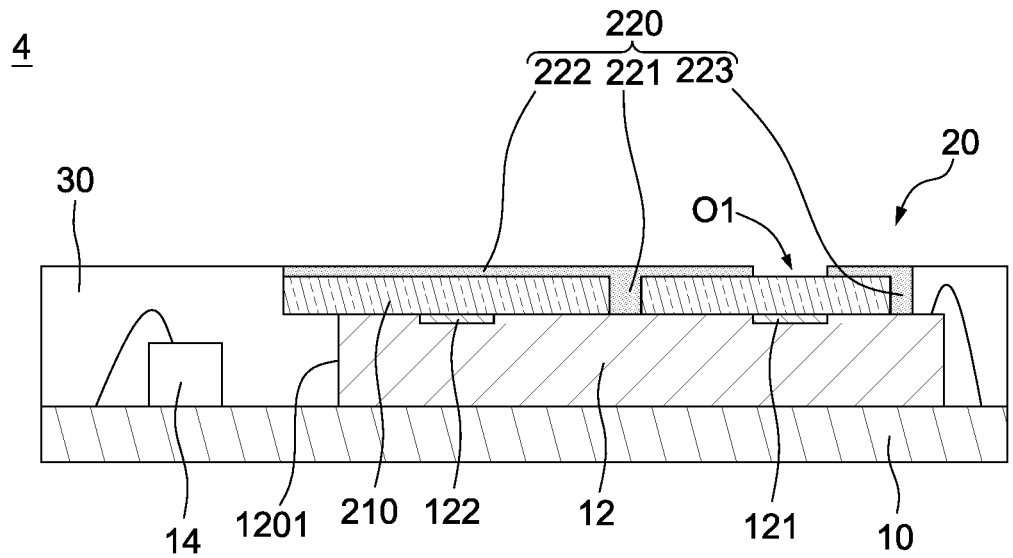
FIG. 4 illustrates a cross-sectional view of an optical package structure in accordance with some embodiments of the present disclosure.

FIG. 4 illustrates a cross-sectional view of an optical package structure 4 in accordance with some embodiments of the present disclosure. The optical package structure 4 is similar to the optical package structure 1A in FIG. 1A except that, for example, a portion of the bumping structure 20 of the optical package structure 4 is overhanging an edge of the die 12.

In some embodiments, a portion of the bumping structure 20 is overhang the sidewall 1201 of the die 12. In some embodiments, a portion of the light-transmitting portion 210 is overhanging an edge (e.g., the sidewall 1201) of the die 12. In some embodiments, a portion of the blocking layer 222 of the light-blocking portion 220 is overhanging an edge (e.g., the sidewall 1201) of the die 12.

Figure 5A:
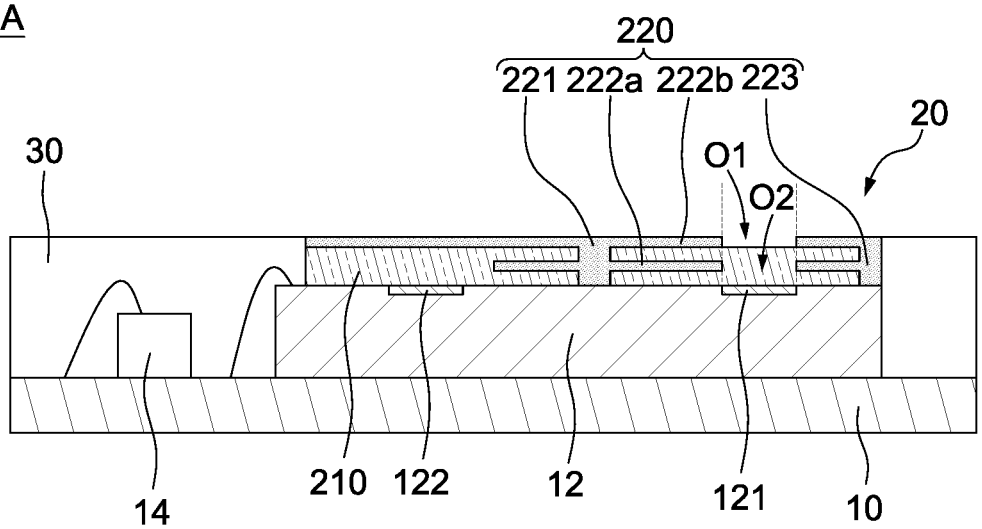
FIG. 5A illustrates a cross-sectional view of an optical package structure in accordance with some embodiments of the present disclosure.

FIG. 5A illustrates a cross-sectional view of an optical package structure 5A in accordance with some embodiments of the present disclosure. The optical package structure 5A is similar to the optical package structure 1A in FIG. 1A except that, for example, the light-blocking portion 220 of the bumping structure 20 of the optical package structure 5A may include at least one sub-layer.

In some embodiments, the light-blocking portion 220 includes one or more sub-layers, for example, sub-layers 222a and 222b. In some embodiments, the one or more sub-layers define an opening O1 exposing the optical region 121 of the die 12. In some embodiments, each of the one or more sub-layers is composed of a patterned light-blocking layer that is free from covering the die 14.

In some embodiments, the sub-layers 222a and 222b are connected to the wall structure 221. In some embodiments, the sub-layers 222a and 222b are substantially perpendicular to the wall structure 221. In some embodiments, the blocking layer of the light-blocking portion 220 includes the upper-most sub-layer 222b. In some embodiments, the sub-layer 222a of the light-blocking portion 220 is embedded in the light-transmitting portion 210.

In some embodiments, the sub-layer 222b defines an opening O1 exposing the optical region 121 of the die 12. In some embodiments, the sub-layer 222b is over the sub-layer 222a, and the sub-layer 222a defines an opening O2 overlapping the opening O1. In some embodiments, a size of the opening O1 is substantially the same as a size of the opening O2.

Figure 5B:
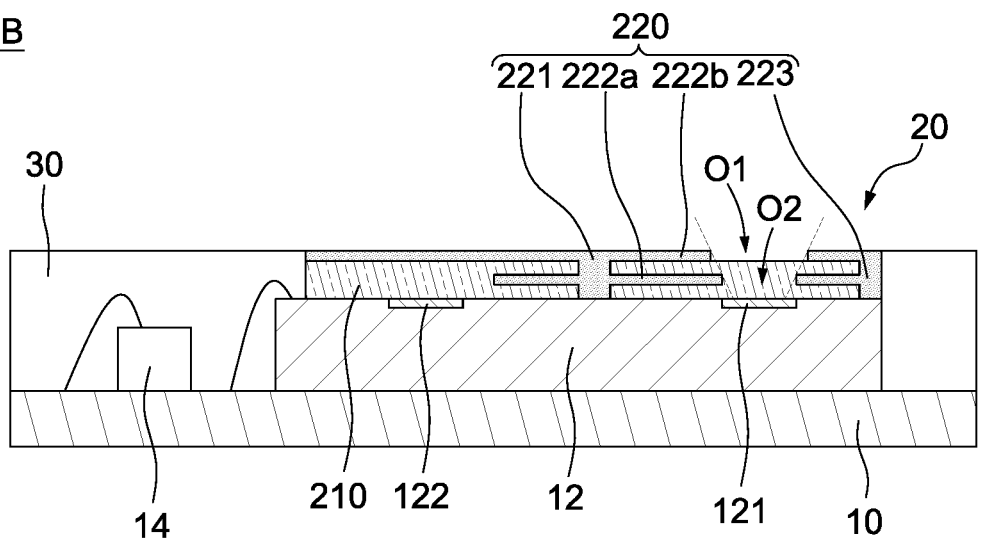
FIG. 5B illustrates a cross-sectional view of an optical package structure in accordance with some embodiments of the present disclosure.

FIG. 5B illustrates a cross-sectional view of an optical package structure 5B in accordance with some embodiments of the present disclosure. The optical package structure 5B is similar to the optical package structure 5A in FIG. 5A except that, for example, the at least one sub-layer of the light-blocking portion 220 of the bumping structure 20 of the optical package structure 5B has a different structure.

In some embodiments, a size of the opening O1 defined by the sub-layer 222b is different from a size of the opening O2 defined by the sub-layer 222a. In some embodiments, a size of the opening O1 defined by the sub-layer 222b is greater than a size of the opening O2 defined by the sub-layer 222a. In some embodiments, the design of the openings O1 and O2 defines a relatively large light receiving range or view angle of the optical region 121 of the die 12.

Figure 5C:
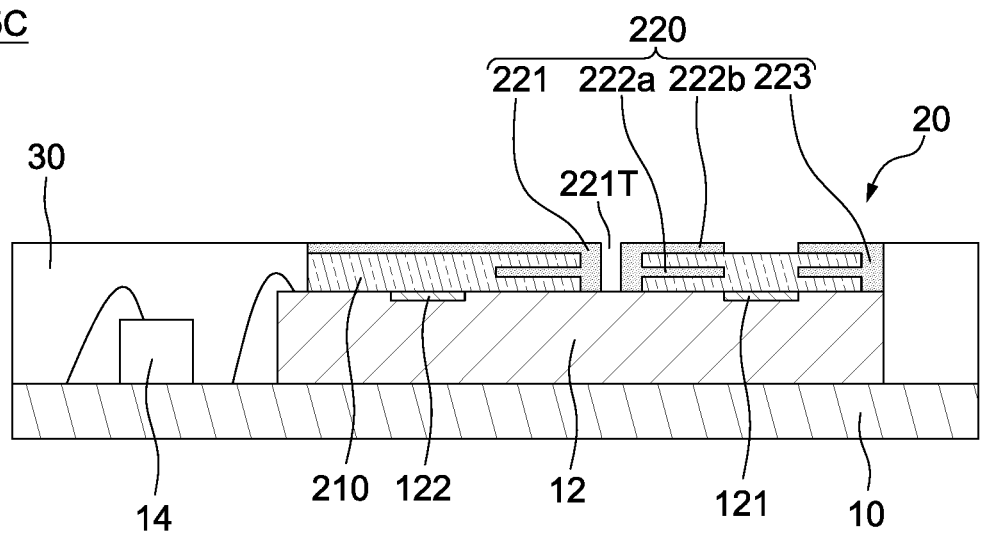
FIG. 5C illustrates a cross-sectional view of an optical package structure in accordance with some embodiments of the present disclosure.

FIG. 5C a cross-sectional view of illustrates an optical package structure 5C in accordance with some embodiments of the present disclosure. The optical package structure 5C is similar to the optical package structure 5A in FIG. 5A except that, for example, the light-blocking portion 220 of the bumping structure 20 of the optical package structure 5B has a trench 221T within the wall structure 221.

Figure 6A:
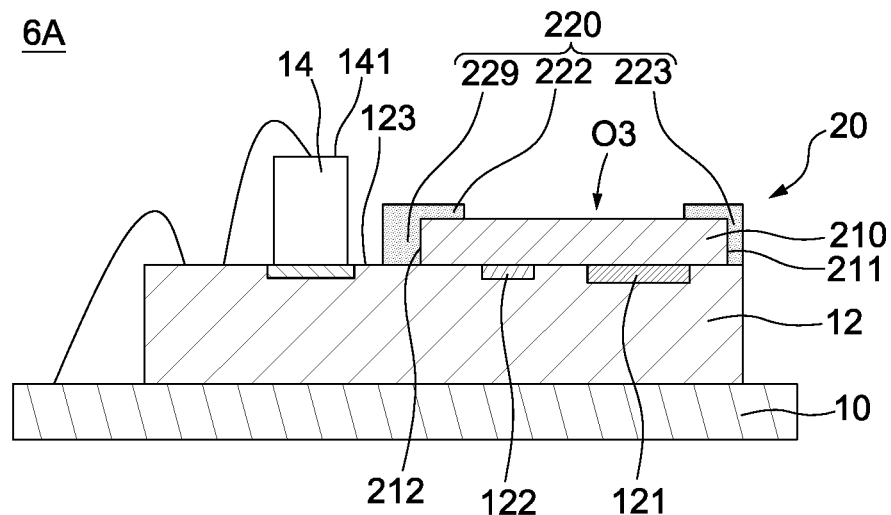
FIG. 6A illustrates a cross-sectional view of an optical package structure in accordance with some embodiments of the present disclosure.

FIG. 6A illustrates a cross-sectional view of an optical package structure 6A in accordance with some embodiments of the present disclosure. The optical package structure 6A is similar to the optical package structure 1A in FIG. 1A, and the differences are described below.

In some embodiments, the die 14 is disposed on a top surface (i.e., the surface 123) of the die 12. In some embodiments, the die 14 is electrically connected to the die 12 through wire bond technique. In some embodiments, the die 12 is electrically connected to the carrier 10 through wire bond technique. In some embodiments, a top surface of the light-blocking portion 220 is between the top surface (i.e., the surface 123) of the die 12 and the top surface (i.e., the surface 141) of the die 14.

In some embodiments, the light-blocking portion 220 further includes a wall structure 229 covering the sidewall 212 of the light-transmitting portion 210 proximal to the die 14. In some embodiments, the wall structures of the light-blocking portion 220 surround the four sidewalls of the light-transmitting portion 210. In some embodiments, the blocking layer 222 of the light-blocking portion 220 defines an opening O3 exposing the optical region 121 and the optical region 122 from a top view perspective. In some embodiments, the light-blocking portion 220 is free of a wall structure between or separating the optical region 121 and the optical region 122. In some embodiments, the optical region 121 and the optical region 122 are configured to detect lights with different wavelengths. For example, one of the optical regions 121 and 122 may include an IR sensing region, and the other one of the optical regions 121 and 122 may include a visible light sensor. In some embodiments, the optical package structure 6A includes a proximity sensor, a biosensor, a LiDAR sensor, and/or a spectrum meter.

Figure 6B:
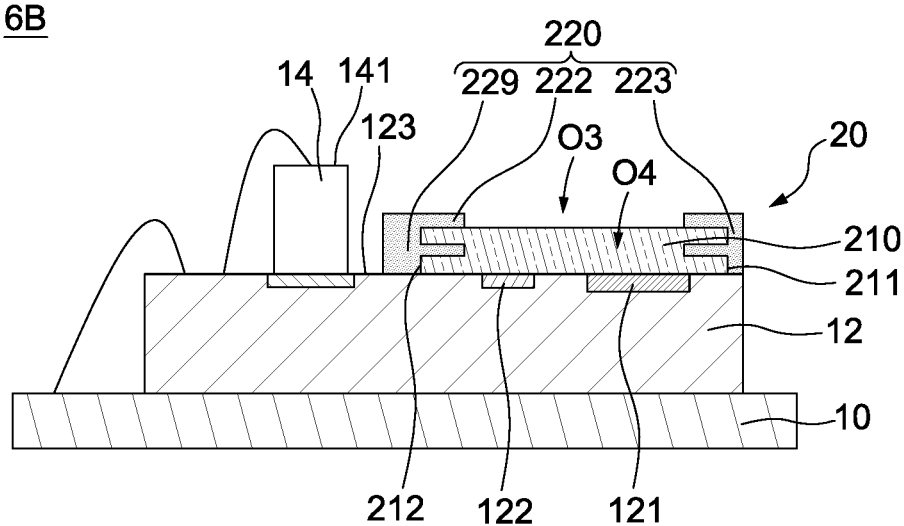
FIG. 6B illustrates a cross-sectional view of an optical package structure in accordance with some embodiments of the present disclosure.

FIG. 6B illustrates a cross-sectional view of an optical package structure 6B in accordance with some embodiments of the present disclosure. The optical package structure 6B is similar to the optical package structure 6A in FIG. 6A except that, for example, the light-blocking portion 220 of the bumping structure 20 of the optical package structure 6B includes one or more sub-layers.

In some embodiments, a sub-layer included in the blocking layer 220 defines an opening O3 exposing the optical regions 121 and 122. In some embodiments, a sub-layer embedded in the light-transmitting portion 210 defines an opening O4 overlapping the opening O3. In some embodiments, a size of the opening O3 is substantially the same as a size of the opening O4.

Figure 6C:
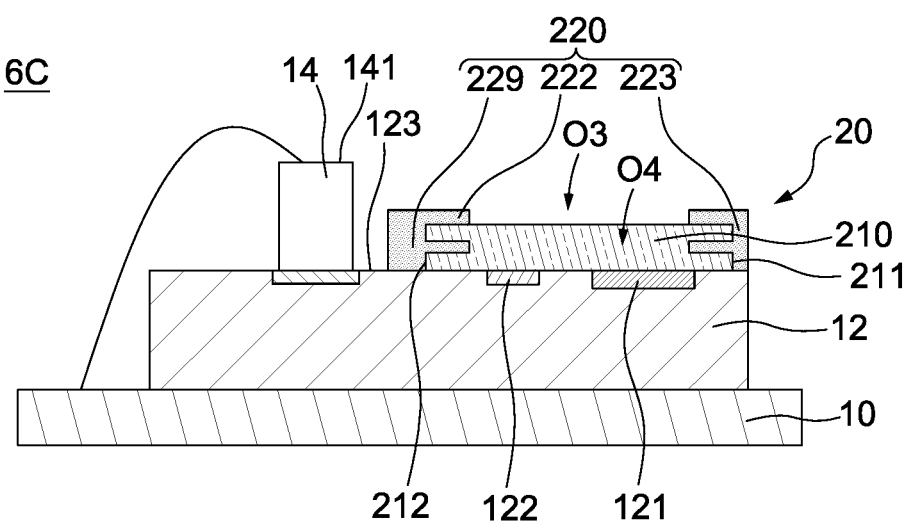
FIG. 6C illustrates a cross-sectional view of an optical package structure in accordance with some embodiments of the present disclosure.

FIG. 6C illustrates a cross-sectional view of an optical package structure 6C in accordance with some embodiments of the present disclosure. The optical package structure 6C is similar to the optical package structure 6B in FIG. 6B except that, for example, the die 14 is directly electrically connected to the carrier 10.

In some embodiments, the die 14 is electrically connected to the carrier through wire bond technique. In some embodiments, the die 14 is directly electrically connected to the carrier 10 through one or more bonding wires.

Figure 6D:
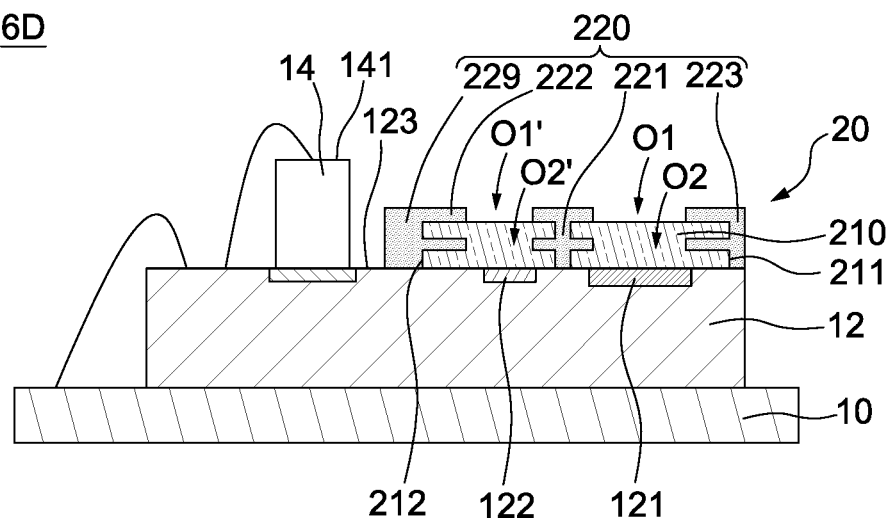
FIG. 6D illustrates a cross-sectional view of an optical package structure in accordance with some embodiments of the present disclosure.

FIG. 6D illustrates a cross-sectional view of an optical package structure 6D in accordance with some embodiments of the present disclosure. The optical package structure 6D is similar to the optical package structure 6B in FIG. 6B except that, for example, the light-blocking portion 220 of the bumping structure 20 of the optical package structure 6D further includes a wall structure 221.

In some embodiments, the wall structure 221 is between the optical region 121 and the optical region 122. In some embodiments, a sub-layer included in the blocking layer 220 defines an opening O1 exposing the optical region 121 and an opening O1' exposing the optical region 122. In some embodiments, a sub-layer embedded in the light-transmitting portion 210 defines an opening O2 overlapping the opening O1 and an opening O2' overlapping the opening O1'. In some embodiments, a size of the opening O1 is substantially the same as a size of the opening O2. In some embodiments, a size of the opening O1' is substantially the same as a size of the opening O2'. In some embodiments, the optical package structure 6D includes a proximity sensor, a biosensor, a LiDAR sensor, and/or a spectrum meter.

Figure 6E:
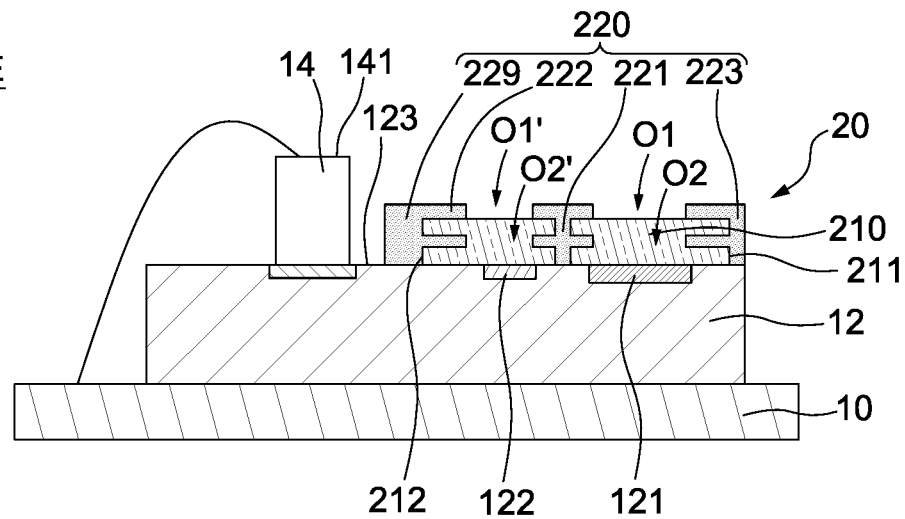
FIG. 6E illustrates a cross-sectional view of an optical package structure in accordance with some embodiments of the present disclosure.

FIG. 6E illustrates a cross-sectional view of an optical package structure 6E in accordance with some embodiments of the present disclosure. The optical package structure 6E is similar to the optical package structure 6D in FIG. 6D except that, for example, the die 14 is directly electrically connected to the carrier 10.

In some embodiments, the die 14 is electrically connected to the carrier through wire bond technique. In some embodiments, the die 14 is directly electrically connected to the carrier 10 through one or more bonding wires.

Figure 6F:
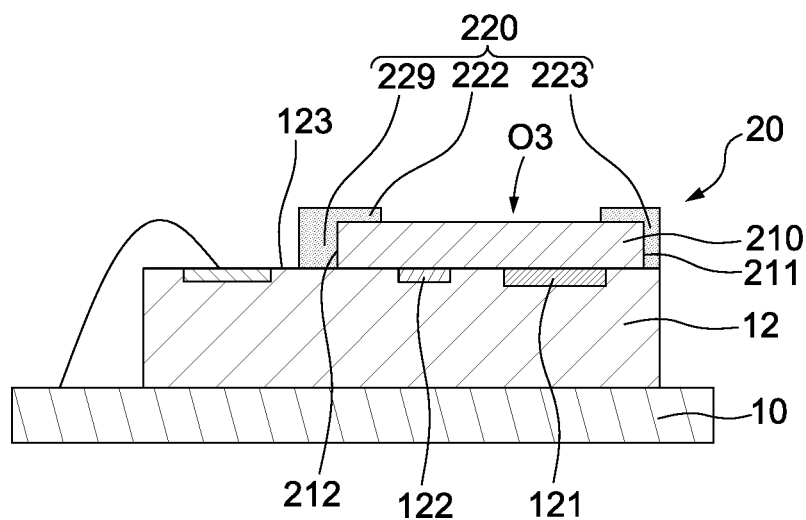
FIG. 6F illustrates a cross-sectional view of an optical package structure in accordance with some embodiments of the present disclosure.

FIG. 6F illustrates a cross-sectional view of an optical package structure 6F in accordance with some embodiments of the present disclosure. The optical package structure 6F is similar to the optical package structure 6A in FIG. 6A except that, for example, the optical regions 121 and 122 may include sensing and light-emitting regions.

In some embodiments, one of the optical regions 121 and 122 includes a sensing region, and the other one of the optical regions 121 and 122 includes a light-emitting region. In some embodiments, sensing and light-emitting regions (i.e., the optical regions 121 and 122) are integrated in one die 12. In some embodiments, a wall structure (e.g., the wall structure 211 as illustrated in FIG. 6D, not shown in FIG. 6F) may be disposed between the optical region 121 and the optical region 122 for further reducing cross-talk. In some embodiments, the die 12 is electrically connected to the carrier 10 through one or more bonding wires connected to a pad of the die 12.

Figure 6G:
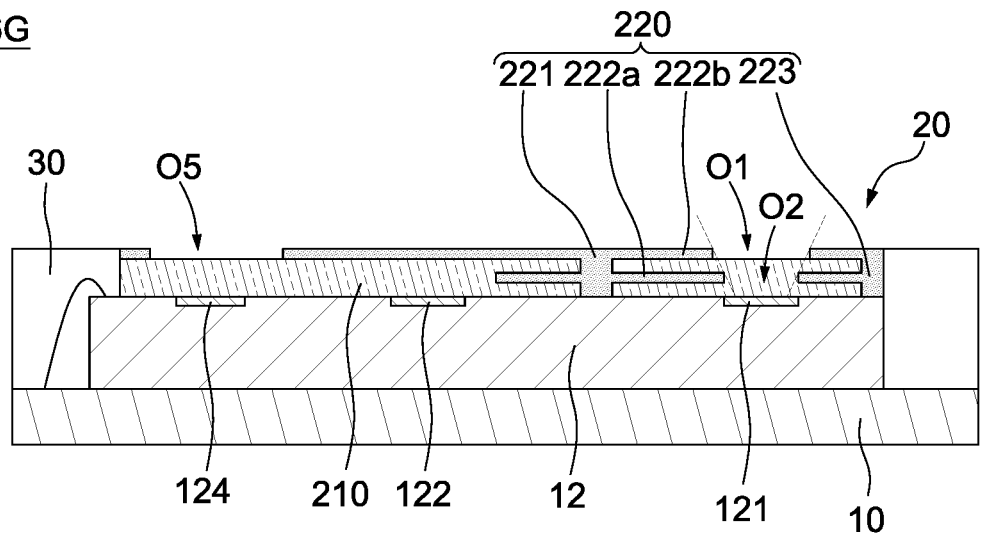
FIG. 6G illustrates a cross-sectional view of an optical package structure in accordance with some embodiments of the present disclosure.

FIG. 6G illustrates a cross-sectional view of an optical package structure 6G in accordance with some embodiments of the present disclosure. The optical package structure 6G is similar to the optical package structure 5B in FIG. 5B except that, for example, the die 12 includes optical regions 121, 122, and 124.

In some embodiments, sensing and light-emitting regions (i.e., the optical regions 121, 122, and 124) are integrated in one die 12. In some embodiments, the optical package structure 6G does not include a light-emitting device (e.g., the die 14 illustrated in FIG. 5B) adjacent to the die 12. In some embodiments, the optical regions 121 and 122 include sensing regions, and the optical region 124 includes a light-emitting region. In some embodiments, the blocking layer (i.e., the sub-layer 222b) defines an opening O5 exposing the optical region 124 from a top view or a cross sectional view perspective. In some embodiments, each of the one or more sub-layers (e.g., the sub-layers 222a and 222b) is composed of a patterned light-blocking layer that is free from covering the optical region 124. In some embodiments, the die 12 is electrically connected to the carrier 10 through one or more bonding wires. In some embodiments, the optical package structure 6G may be or include a time of flight (TOF) sensor.

FIG. 7A, FIG. 7B, FIG. 7C, FIG. 7D, FIG. 7E, FIG. 7F, FIG. 7G, and FIG. 7H illustrate various operations in a method of manufacturing an optical package structure 5A in accordance with some embodiments of the present disclosure.

In some embodiments, a bumping structure 20 is formed over a substrate 12A by a wafer-level or panel-level packaging operation, for example, a wafer level chip scale package (WLCSP) process. In some embodiments, the bumping structure 20 includes a light-transmitting portion 210 and a light-blocking portion 220 embedded in the light-transmitting portion 210.

In some embodiments, forming the bumping structure 20 may include the following operations: forming a light-transmitting material on the substrate 12A; patterning the light-transmitting material to form the light-transmitting portion 210 on the substrate 12A; forming a light-blocking material on or embedded in the light-transmitting portion

210; and patterning the light-blocking material to form the light-blocking layer 220. In some embodiments, the light-transmitting portions 210 are separated from each other by one or more gaps. In some embodiments, each of the light-transmitting portions 210 has one or more openings or recesses, and the light-blocking portions 220 is formed on and within the openings or recesses of the light-transmitting portion 210. In some embodiments, the bumping structure 20 may be manufactured by operations illustrated in FIGS. 7A-7E.

Figure 7A:
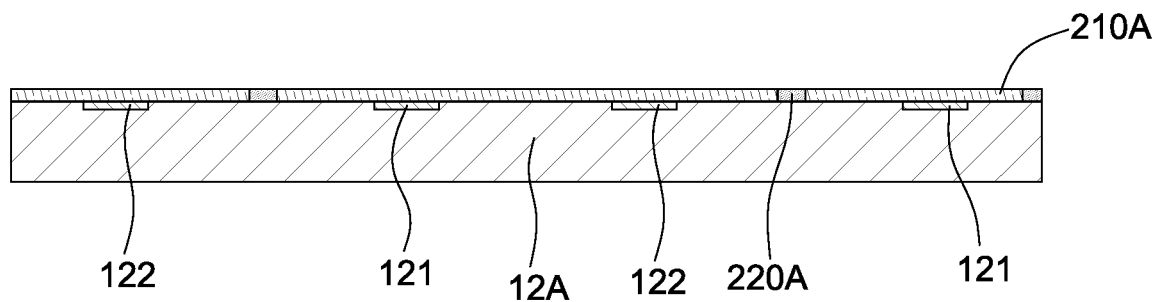
FIG. 7A, FIG. 7B, FIG. 7C, FIG. 7D, FIG. 7E, FIG. 7F, FIG. 7G, and FIG. 7H illustrate various operations in a method of manufacturing an optical package structure in accordance with some embodiments of the present disclosure.

Referring to FIG. 7A, a light-transmitting material 210A is formed on the substrate 12A, the light-transmitting material 210A is patterned to form one or more openings or recesses, and a light-blocking material 220A is formed within the openings or recesses of the light-transmitting material 210A. The light-blocking material 210A and the light-blocking material 220A may be formed by a suitable deposition process or a coating process. In some embodiments, the light-transmitting material 210A may be patterned by performing one or more lithography operations, for example, by (i) forming a photoresist or mask on the light-transmitting material 210A; (ii) defining a predetermined pattern on the photoresist or mask by, for example, lithographic technique; (iii) removing portions of the light-transmitting material 210A according to the predetermined pattern to form the openings or recesses; and (iv) removing the photoresist or mask. In some embodiments, portions of the light-blocking material 220A exceeding over the top surface of the light-transmitting material 210A may be removed.

Figure 7B:
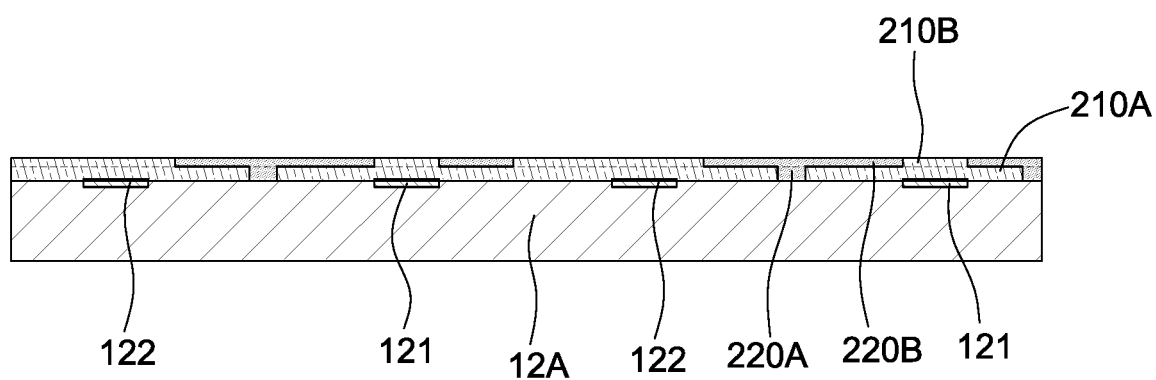

Referring to FIG. 7B, a light-transmitting material 210B is formed on the light-transmitting material 210A and the light-blocking material 220A, the light-transmitting material 210B is patterned to form one or more openings or recesses, and a light-blocking material 220B is formed within the openings or recesses of the light-transmitting material 210B. In some embodiments, the light-transmitting material 210B may be patterned by operations similar to those for patterning the light-transmitting material 210A. In some embodiments, portions of the light-blocking material 220B exceeding over the top surface of the light-transmitting material 210B may be removed.

Figure 7C:
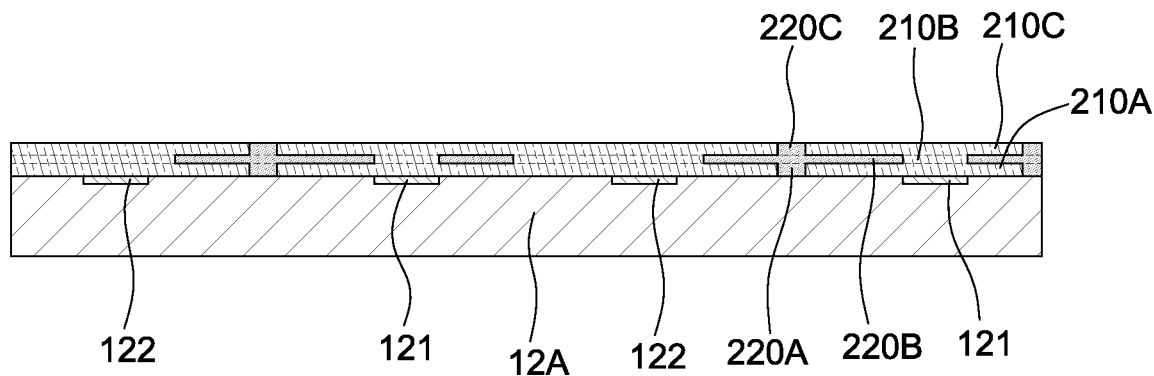

Referring to FIG. 7C, a light-transmitting material 210C is formed on the light-transmitting material 210B and the light-blocking material 220B, the light-transmitting material 210C is patterned to form one or more openings or recesses, and a light-blocking material 220C is formed within the openings or recesses of the light-transmitting material 210C. In some embodiments, the light-transmitting material 210C may be patterned by operations similar to those for patterning the light-transmitting material 210B. In some embodiments, portions of the light-blocking material 220C exceeding over the top surface of the light-transmitting material 210C may be removed.

Figure 7D:
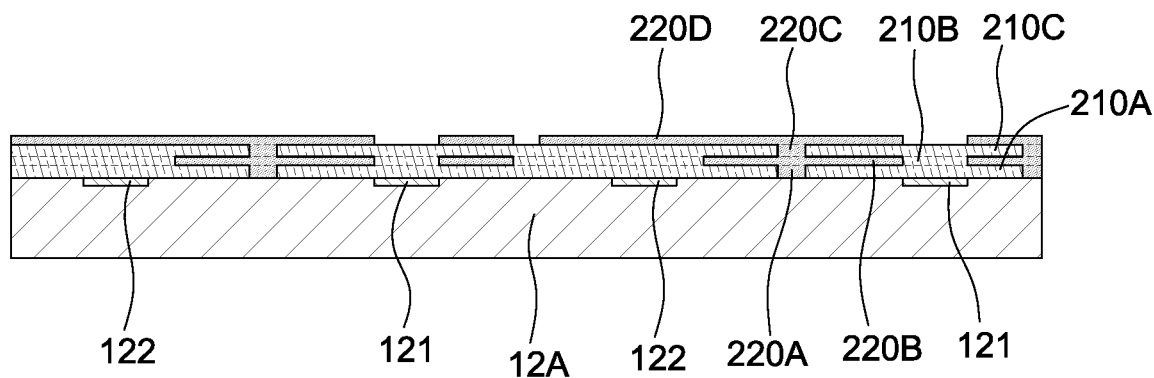

Referring to FIG. 7D, a light-blocking material is formed on the light-transmitting material 210C and the light-blocking material 220C, and then the as-formed light-blocking material is patterned to form a light-blocking material 220D.

Figure 7E:
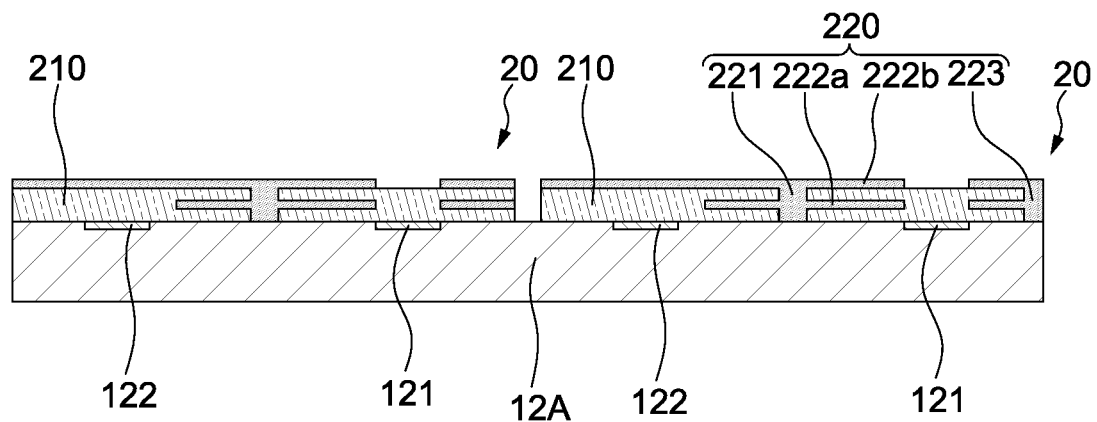

Referring to FIG. 7E, a portion of the patterned light-transmitting materials 210A, 210B and 210C projecting over a saw street (not shown) between adjacent die regions are removed to form separate bumping structures 20 prior to a die saw operation.

Figure 7F:
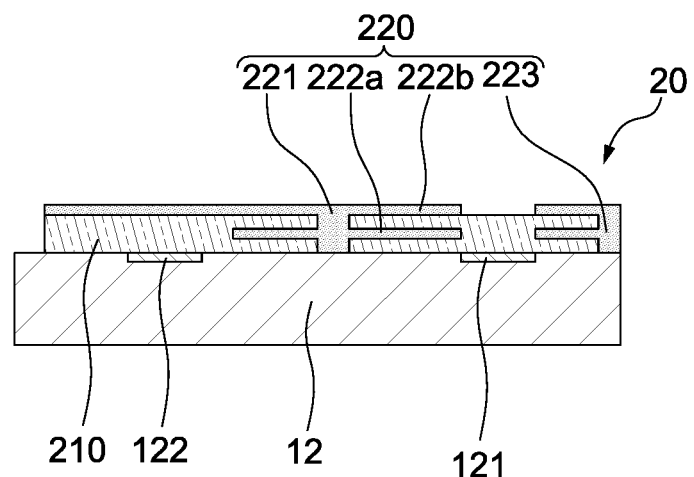

Referring to FIG. 7F, a plurality of dies 12 are obtained by singulating the substrate 12A. In some embodiments, each of the bumping structures 20 is on each of the dies 12.

Figure 7G:
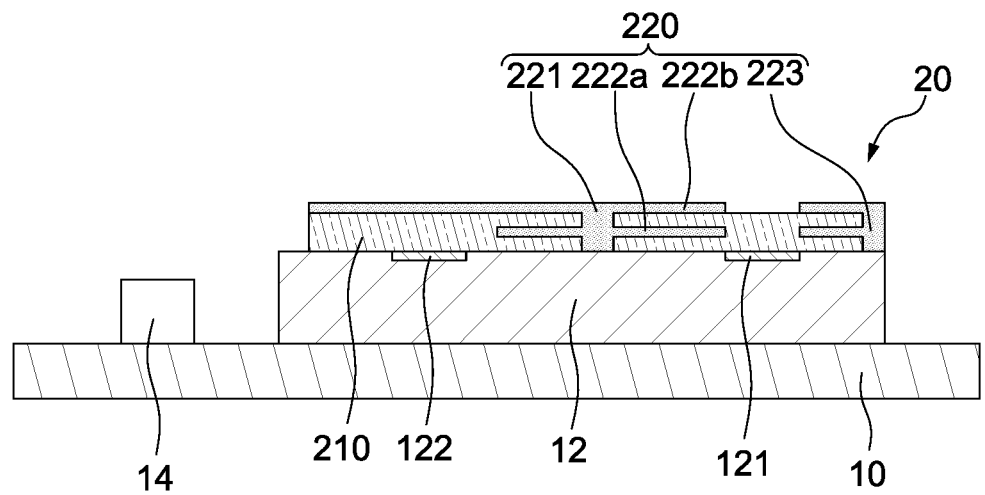

Referring to FIG. 7G, a die 14 is integrated with one of the dies 12 through a carrier 10. In some embodiments, the die 14 and one of the dies 12 are disposed on a carrier 10. In some embodiments, integrating the die 14 with one of the dies 12 is performed after forming the bumping structure 20.

Figure 7H:
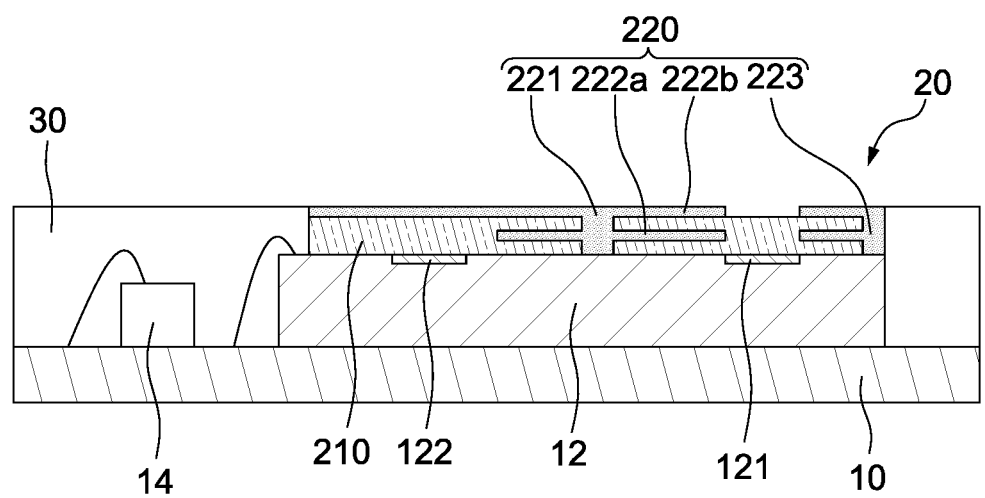

Referring to FIG. 7H, an encapsulant 30 is formed to encapsulate the die 14 after forming the bumping structure 20. As such, the optical package structure 5A as illustrated in FIG. 5A is formed.

In some cases where dies (for example, including optical regions/components) are reconstituted and then encapsulated, followed by forming a structure of stacked layers including a light-blocking feature (e.g., an RDL) on the encapsulated dies, since the structure of stacked layers is formed on the dies, top surfaces of the dies are required to be substantially coplanar in order to form uniform stacked layers including the light-blocking feature. In addition, since the structure of stacked layers is formed on all of the dies, any manufacturing errors occurred in the formation of any of the stacked layers or any one of the dies failed in electrical performance inspection, the rework operation needs to start over from reconstituting all of the dies. Therefore, the yield may be lowered, and the manufacturing costs may be increased.

In contrast, according to some embodiments of the present disclosure, the bumping structure 20 including a light-blocking feature (e.g., the light-blocking portion 220) is formed on the substrate 12A by a WLCSP process prior to singulating the substrate 12A to obtain the dies 12, and the die 14 is integrated with the die 12 in a way that the bumping structure 20 is free from covering the die 14, such that the top surface of the die 12 is not necessarily coplanar with the top surface of the die 14, thus the design flexibility is increased, and the manufacturing cost is reduced as well.

Figure 8A:
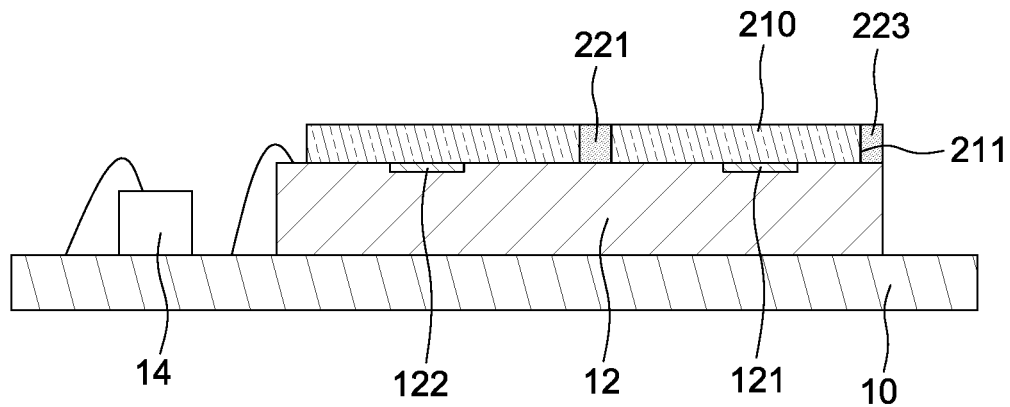
FIG. 8A and FIG. 8B illustrate various operations in a method of manufacturing an optical package structure in accordance with some embodiments of the present disclosure.
Figure 8B:
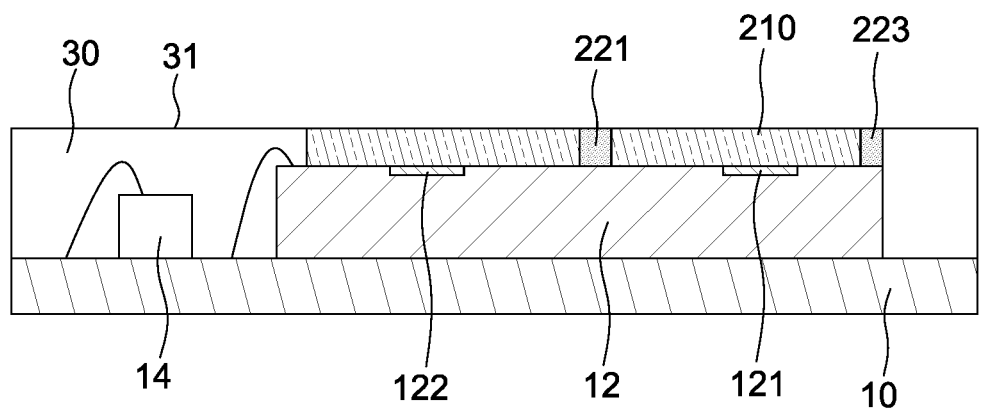

FIG. 8A and FIG. 8B illustrate various operations in a method of manufacturing an optical package structure 3 in accordance with some embodiments of the present disclosure.

Referring to FIG. 8A, dies 12 and 14 are disposed on a carrier 10, a light-transmitting portion 210 is formed on the die 12, and a wall structure 221 is formed embedded in the light-transmitting portion 210. In some embodiments, a wall structure 223 is further formed on a sidewall 211 of the light-transmitting portion 210 distal to the die 14.

In some embodiments, the light-transmitting portion 210 may be formed by the following operations: forming a light-transmitting material on the die 12, and patterning the light-transmitting material by performing one or more lithography operations to form one or more openings or recesses in the light-transmitting material to form the light-transmitting portion 210. In some embodiments, the wall structures 221 and 223 may be formed by forming a light-blocking material in the one or more openings or recesses of the light-transmitting portion 210.

Referring to FIG. 8B, an encapsulant 30 is formed to encapsulate the die 14. In some embodiments, the surface 31 (also referred to as "the top surface") of the encapsulant 30 is substantially coplanar with a top surface of the light-transmitting portion 210.

Next, referring to FIG. 3, a blocking layer 222 is formed on the light-transmitting portion 210 and the wall structures 221 and 223 by a patterning operation for example. The blocking layer 222 is connected to the wall structures 221 and 223 to form a light-blocking portion 220, which together with the light-transmitting portion 210 form a bumping structure 20 on the die 12. The blocking layer 222 covers both the light-transmitting portion 210 and the surface 31 of the encapsulant 30. As such, an optical package structure 3 as illustrated in FIG. 3 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least °$10^5$ S/m or at least °$10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optical package structure, comprising:
    a first die on a carrier;
    a bumping structure over the first die, comprising a light-transmitting portion and a light-blocking portion embedded in the light-transmitting portion; and
    a second die electrically connected to the carrier;
    wherein the light-blocking portion of the bumping structure is free from covering the second die;
    wherein the first die comprises a first optical region and a second optical region between the first optical region and the second die, and the light-blocking portion is projecting over the second optical region; and
    wherein the light-blocking portion comprises a first wall structure between the first optical region and the second optical region.

2. The optical package structure of claim 1, wherein the first die comprises a detecting device, and the second die comprises a light-emitting device.

3. The optical package structure of claim 1, wherein the first optical region is exposed from the light-blocking portion.

4. The optical package structure of claim 1, wherein the light-blocking portion has a trench within the first wall structure.

5. The optical package structure of claim 1, wherein the light-blocking portion comprises a portion extending towards the second die and overhanging an edge of the first die.

6. The optical package structure of claim 1, further comprising an encapsulant encapsulating the second die.

7. The optical package structure of claim 1, wherein the light-blocking portion comprises:
    at least one sub-layer defining an opening exposing the first optical region of the first die.

8. The optical package structure of claim 7, wherein the light-blocking portion comprises:
    a first sub-layer over the first die, the first sub-layer defining a first opening exposing the first optical region of the first die; and
    a second sub-layer over the first sub-layer, the second sub-layer defining a second opening overlapping the first opening, wherein a size of the second opening is greater than a size of the first opening.

9. The optical package structure of claim 7, wherein each of the at least one sub-layer is composed of a patterned light-blocking layer free from covering the second die.

10. The optical package structure of claim 1, wherein the second die is disposed on a top surface of the first die.

11. The optical package structure of claim 1, wherein the light-blocking portion comprises a second wall structure covering a side surface of the light-transmitting portion distal to the second die.

12. The optical package structure of claim 1, wherein the light-blocking portion comprises a second wall structure on a sidewall of the first die proximal to the second die.

13. The optical package structure of claim 6, wherein the light-blocking portion comprises a portion directly on the encapsulant.

14. The optical package structure of claim 13, wherein a top surface of the encapsulant is substantially non-coplanar to a first top surface of the first die.

15. The optical package structure of claim 14, wherein the first top surface of the first die is substantially non-coplanar to a second top surface of the second die.

16. The optical package structure of claim 1, wherein a portion of the bumping structure is protruded out of a periphery of the first die.

17. The optical package structure of claim 1, wherein a top surface of the first die and a top surface of the second die are at different elevations.

18. The optical package structure of claim 1, wherein the light-blocking portion comprises an insulating material, a photoresist material or carbon black.

* * * * *